US008635571B1

(12) United States Patent  
Goldman

(10) Patent No.: US 8,635,571 B1  
(45) Date of Patent: Jan. 21, 2014

(54) INTEGRATING MULTIPLE FPGA DESIGNS BY MERGING CONFIGURATION SETTINGS

(71) Applicant: Altera Corporation, San Jose, CA (US)

(72) Inventor: David Samuel Goldman, Washington, DC (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/656,361

(22) Filed: Oct. 19, 2012

(51) Int. Cl.
*G06F 17/50* (2006.01)

(52) U.S. Cl.
USPC .......................................... 716/117; 716/116

(58) Field of Classification Search
USPC ................................................ 716/110–117
See application file for complete search history.

(56) References Cited

U.S. PATENT DOCUMENTS

2010/0218146 A1* 8/2010 Platzker et al. .................... 716/4
2011/0145778 A1* 6/2011 Chen ............................ 716/136

\* cited by examiner

*Primary Examiner* — Binh Tat
(74) *Attorney, Agent, or Firm* — Weaver Austin Villeneuve & Sampson, LLP

(57) ABSTRACT

This disclosure relates generally to field-programmable gate arrays (FPGAs). Some implementations relate to methods and systems for transmitting and integrating an intellectual property (IP) block with another user's design. The IP developer can design the IP block to include both a secret portion and a public portion. The IP block developer can send or otherwise provide the IP block to another IP user without disclosing the functional description of the secret portion of the IP block. In some implementations, the IP developer provides the public portion to the IP user at the register-transfer-level (RTL) level, as a hardware description language (HDL)-implemented design, or as a synthesizable netlist. In some implementations, the IP developer provides the secret portion of the IP block to the user in the form of programming bits without providing an HDL, RTL, or netlist implementation of the secret portion.

16 Claims, 7 Drawing Sheets

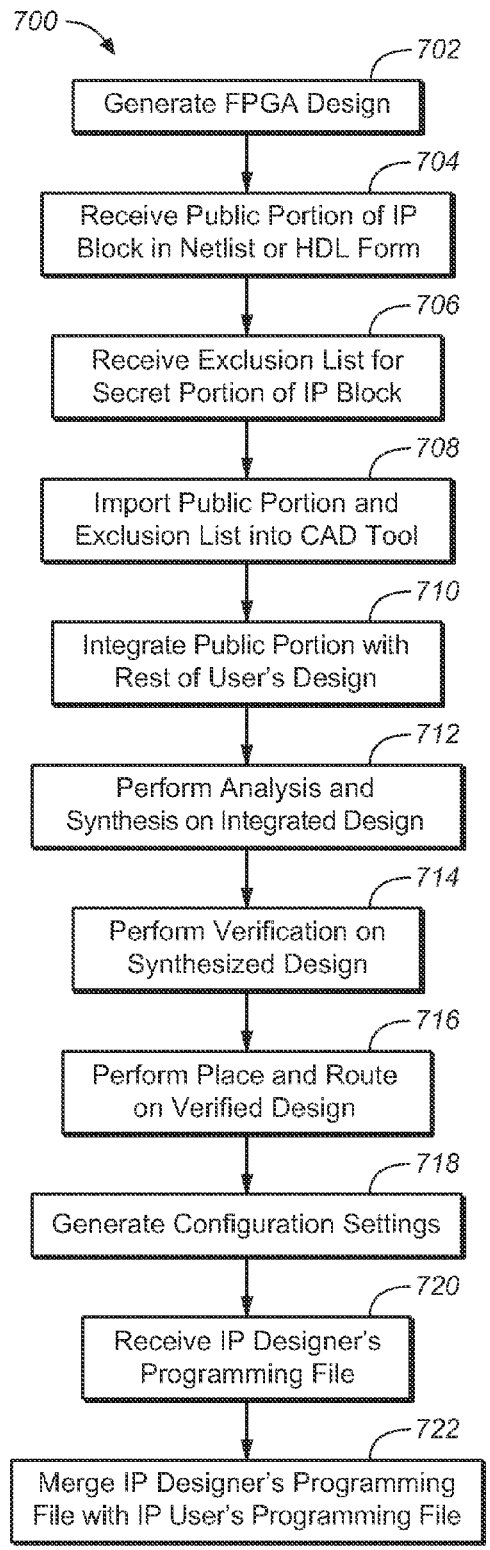
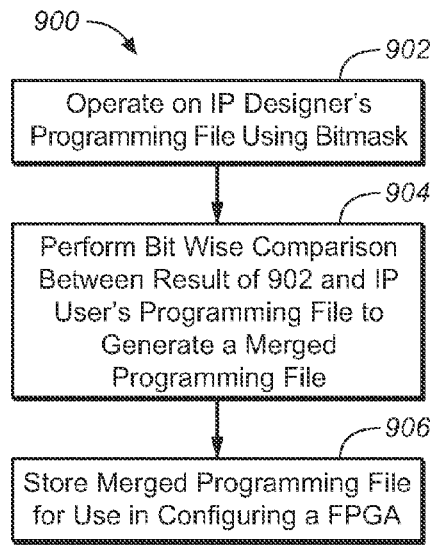
FIG. 9
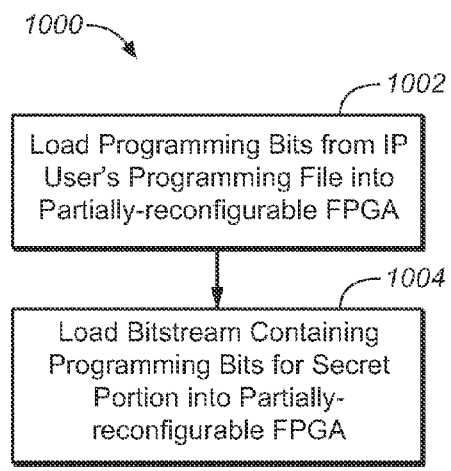
FIG. 10
FIG. 7

US 8,635,571 B1

INTEGRATING MULTIPLE FPGA DESIGNS BY MERGING CONFIGURATION SETTINGS

FIELD OF THE INVENTION

This disclosure relates generally to field-programmable gate arrays (FPGAs), and more specifically, to methods and systems for transmitting and integrating FPGA circuit designs.

BACKGROUND

In many modern applications, FPGA circuit developers design only a portion of an entire FPGA design. For example, one FPGA circuit developer can design a processor core, another FPGA developer can design a memory block, another can design a memory controller, and still others can design other portions of the FPGA design. The various circuit developers may work for a single entity as part of different teams or for different entities (e.g., for different circuit developers in different business enterprises). Because of, for example, the difficulty and expense of designing and verifying a circuit design, and the commerciability of the design, a designing entity may desire to keep the circuit design a secret, or at least desire not to disclose, or limit the disclosure of, the circuit design to other parties such as other developers, users, designers, or customers. A semiconductor intellectual property core, or simply "IP core" or "IP block," can refer to a unit of logic, a cell, a chip layout, or otherwise to a circuit design to be used in conjunction with other circuits as part of a larger FPGA circuit design. The IP block is the design of, and typically intellectual property of, a particular circuit developer. The IP developer (or "designer") may sell or license use of the IP block to another developer or user that then implements the IP block into that user's own larger design, which may itself be a part of a larger design.

Although IP blocks can be sent to other parties, such as a user of an FPGA, as a netlist, IP blocks are typically sent at the register-transfer-level (RTL) level, such as in the form of a synthesizable hardware description language (HDL)-implemented design. Because the design is delivered in an HDL form, the user can modify the design at the functional level. However, as described above, because a developer may wish to keep the design secret (e.g., as a trade secret), because of the time and expense involved with verification, or for other reasons, a developer may not want the user to be able to have such access to the functional description of the circuit design. For example, because a circuit developer may not offer a warranty or support for the IP block if the design is modified, the circuit developer may desire to prevent an FPGA user from having access to the functional description of the circuit design. Providing the circuit design to the user as a software netlist can provide better protection against reverse engineering than providing the design in an HDL form, but reverse engineering can still be accomplished. The IP developer may also simply desire to ensure that the end user or customer receives the benefit of the verified implementation for the developer's own goodwill. Additionally, some IP developers are required to have their IP blocks independently verified by a third party (e.g., TÜV Rheinland headquarted in Cologne, Germany) to ensure a product integrating the design will meet functional safety requirements (e.g. the IEC61508 specification). This can be a significantly costly procedure. As such, an IP developer may seek to prevent a second IP user from modifying the IP block so that verification of compliance with functional safety requirements isn't required twice. Additionally, an IP developer may seek to ensure that a verified IP block design is provided to an IP user as it was verified. If the IP developer were to provide an RTL implementation or a netlist implementation of the IP block to the IP user, the IP user's CAD tool might not output the same programming bits for the IP block as the developer intended. Since such methods of transmitting a design do not guarantee that no changes were made to the IP block, the IP user might be required to, or desire to, re-qualify and verify the design.

SUMMARY

This disclosure relates generally to programmable logic devices (PLDs) such as field-programmable gate arrays (FPGAs). Some implementations relate to methods and systems for transmitting and integrating an intellectual property (IP) block with another user's design. The IP developer can design the IP block to include both a secret portion and a public portion. The IP block developer can send or otherwise provide the IP block to another IP user without disclosing the functional description of the secret portion of the IP block. In some implementations, the IP developer provides the public portion to the IP user at the register-transfer-level (RTL) level, as a hardware description language (HDL)-implemented design, or as a synthesizable netlist. In some implementations, the IP developer provides the secret portion of the IP block to the user in the form of programming bits without providing an HDL, RTL, or netlist implementation of the secret portion.

In one aspect of the subject matter disclosed, a method includes generating an HDL implementation of a circuit design to be implemented on a PLD device. The method also includes partitioning the circuit design into a public portion and a secret portion and generating an interface for coupling the public portion and the secret portion. The method further includes generating configuration settings for the secret portion based on the HDL implementation for use in programming the secret portion of the circuit design into the PLD device.

In some implementations, the method further includes analyzing the HDL implementation to generate a hierarchical implementation of the circuit design. In some such implementations, partitioning the circuit design into the public portion and the secret portion is performed at the hierarchical representation level. In some implementations, the interface includes one or more boundary lookup tables (LUTs) for mapping signals from the secret portion to the public portion and from the public portion to the secret portion.

In some implementations, the method further includes generating an exclusion list of resources to be reserved for the secret portion and providing the exclusion list to the user. In some implementations, the method further includes generating an HDL implementation or a netlist implementation of the public portion without the secret portion included and providing the HDL implementation or the netlist implementation of the public portion to a user for integration with circuit design of the user. In some implementations, the method further includes generating an HDL implementation or a netlist implementation of the interface and providing the HDL implementation or the netlist implementation of the interface to the user including one or more boundary locations between the secret portion and the public portion. The configuration settings for the secret portion are also provided to the user. Based on the HDL or netlist implementation of the public portion, the interface, and the exclusion list, a computer-aided design (CAD) tool can be configured to integrate the public portion with the user's circuit design to generate an integrated design in which the resources specified in the exclusion list are reserved for the secret portion.

In some implementations, the configuration settings for the secret portion are generated in the form of programming bits. In some implementations, the programming bits for the secret portion are included as part of a programming file that includes bits for an entire PLD design. In some such implementations, the method further includes generating a bit mask that includes a first set of bits each having a first logical value and a second set of bits each having a second logical value, each of the first set of bits being in a location of the bitmask that corresponds to a programming bit in the programming file used by the secret portion. In some such implementations, when a user's CAD tool operates on the programming file with the bitmask, the tool is enabled to extract the programming bits for the secret portion from the programming file. In some such implementations, the extracted programming bits for the secret portion are configured for integration with programming bits of a programming file generated by the user for the integrated design. In some implementations, the circuit design is to be implemented on an FPGA type of PLD device.

In some other implementations, the circuit design is to be implemented on a partially-reconfigurable FPGA type of PLD device. In some such implementations, the configuration settings for the secret portion are provided in the form of a bitstream of programming bits to the user. The programming bits for the secret portion can be configured for programming into the partially-reconfigurable FPGA device during operation of the FPGA device. In some such implementations, the method further includes encrypting the programming bits for at least the secret portion prior to providing the encrypted programming bits for the secret portion to the user.

In another aspect, a programmable logic device (PLD) is disclosed that is formed by a process that includes generating a hardware description language (HDL) implementation of a first circuit design. The process also includes receiving an HDL or netlist implementation of a public portion of a second circuit design, the second circuit design also including a secret portion. The process also includes receiving an HDL or netlist implementation of an interface between the public portion and the secret portion, the interface including one or more boundary locations between the secret portion and the public portion. The process further includes generating an HDL implementation of an integrated design formed by integrating the HDL implementation of the first circuit design with the public portion of the second design and the interface. The process further includes receiving an exclusion list of recourses to be reserved for a secret portion of the second circuit design. The process further includes generating a programming file for the integrated design including programming bits for configuring the integrated design into the PLD. The process further includes receiving programming bits for the secret portion of the second circuit design. The process further includes generating a merged programming file that contains the programming bits for the integrated design and the programming bits for the secret portion and programming the programming bits in the merged programming file into the PLD.

In some implementations, the PLD is a field-programmable gate array (FPGA). In some implementations, the interface includes one or more boundary lookup tables (LUTs) for mapping signals from the secret portion to the public portion and from the public portion to the secret portion. In some implementations, the programming bits for the secret portion are received as part of a programming file that includes bits for an entire PLD design. In some such implementations, the process further includes receiving a bit mask that includes a first set of bits each having a first logical value and a second set of bits each having a second logical value, each of the first set of bits being in a location of the bitmask that corresponds to a programming bit in the programming file used by the secret portion. In some such implementations, the process further includes operating on the programming file containing the programming bits for the secret portion with the bitmask to extract the programming bits for the secret portion from the programming file and integrating the extracted programming bits with the programming bits for the integrated design to generate the merged programming file.

In another aspect, a programmable logic device (PLD) is disclosed that is formed by a process that includes generating a hardware description language (HDL) implementation of a first circuit design. The process also includes receiving an HDL or netlist implementation of a public portion of a second circuit design, the second circuit design also including a secret portion. The process also includes receiving an HDL or netlist implementation of an interface between the public portion and the secret portion, the interface including one or more boundary locations between the secret portion and the public portion. The process further includes generating an HDL implementation of an integrated design formed by integrating the HDL implementation of the first circuit design with the public portion of the second design and the interface. The process further includes receiving an exclusion list of resources to be reserved for a secret portion of the second circuit design. The process further includes generating a programming file for the integrated design including programming bits for configuring the integrated design into the PLD and programming the programming bits in the programming file for the integrated design into the PLD. The process further includes receiving programming bits for the secret portion of the second circuit design and programming the programming bits for the secret portion of the second circuit design into the PLD after the programming bits for the integrated circuit design have been programmed into the PLD.

In some implementations, the PLD is a partially-reconfigurable FPGA. In some implementations, the interface includes one or more boundary lookup tables (LUTs) for mapping signals from the secret portion to the public portion and from the public portion to the secret portion.

These and other aspects are described further below with reference to the drawings.

BRIEF DESCRIPTION OF THE DRAWINGS

FIG. 6A shows an example bitmask.

FIG. 6B shows a bitstream that results from the bitwise application of the bitmask of FIG. 6A to an example IP developer's programming file.

FIG. 7 shows a flowchart illustrating an example process for integrating an IP block into an IP user's design.

FIG. 8A shows an example portion of the IP user's programming file in which the bits that are to be used by the secret portion are identified with a default value.

FIG. 8B shows a merged programming file (or portion thereof) that results from the bitwise application of the result of FIG. 6B with the portion of the IP user's programming file of FIG. 8A.

FIG. 9 shows a flowchart illustrating an example process for merging configuration settings for a secret portion of an IP block into an IP user's configuration settings.

FIG. 10 shows a flowchart illustrating an example process for merging configuration settings for a secret portion of an IP block into an IP user's configuration settings.

DETAILED DESCRIPTION

Figure 1:
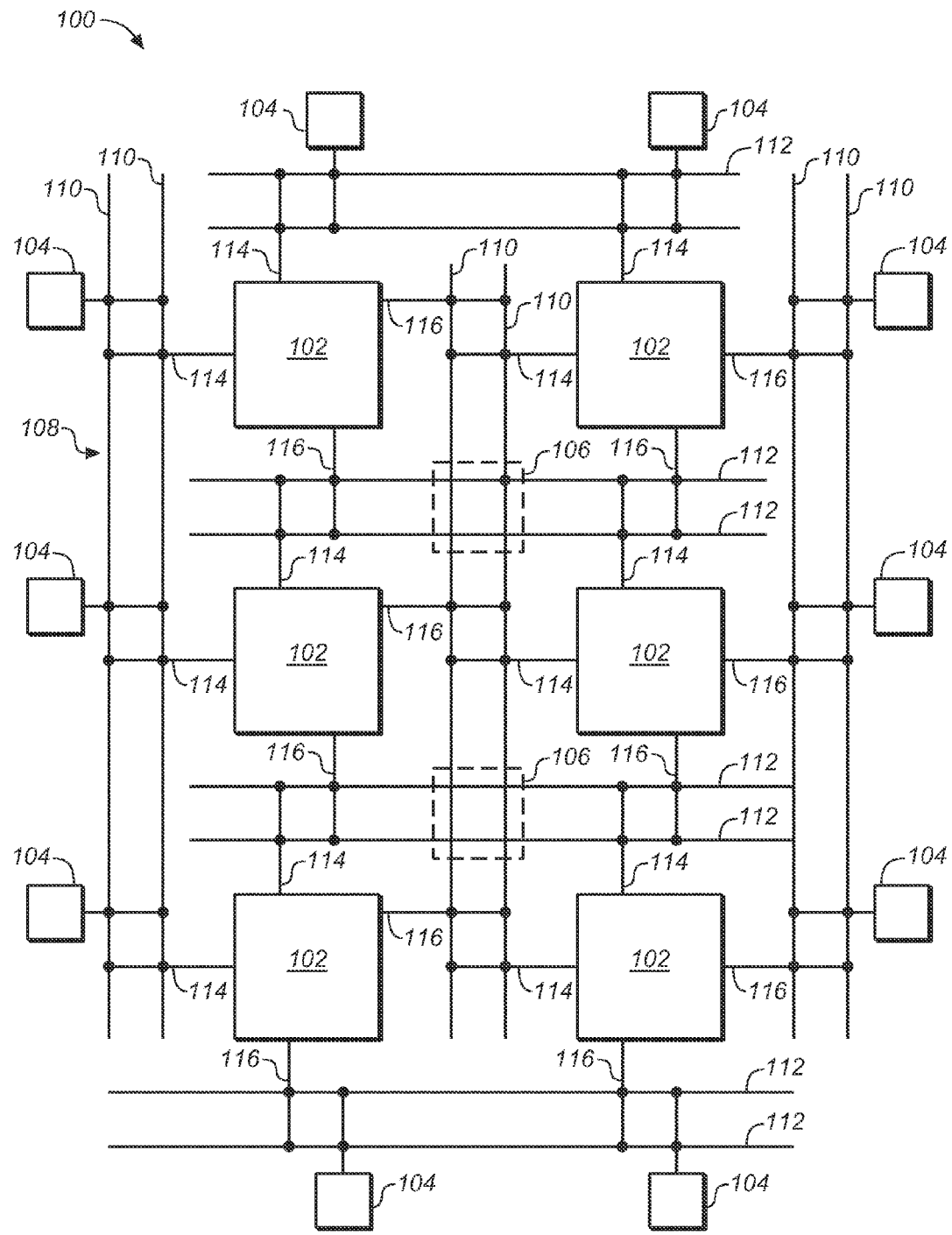
FIG. 1 shows an example implementation of an FPGA architecture.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

This disclosure relates generally to programmable logic devices (PLDs) such as field-programmable gate arrays (FPGAs), and more specifically, to methods and systems for transmitting and integrating FPGA circuit designs. For example, some implementations relate to methods and systems for transmitting and integrating one or more intellectual property (IP) blocks with one or more other IP blocks of another user's design. Particular advantageous implementations enable an IP block developer to send or otherwise provide an IP block to another IP designer, an IP user, or a customer (hereinafter collectively referred to as "users") without disclosing the functional description of a secret portion of the IP block and additionally ensuring that the secret portion is implemented on the PLD in an identical manner. In some implementations, the term "user" may refer to a party that is integrating one or more IP blocks or circuit designs into a final circuit design to be configured or programmed into a physical FPGA device. In particular implementations, the IP developer designs the IP block to include both a secret portion and a public portion. In some implementations, the IP developer provides the public portion to an IP user at the register-transfer-level (RTL) level, as a hardware description language (HDL)-implemented design, or as a synthesizable netlist. In some implementations, a user can then receive the, for example, HDL-implemented representation of the public portion of the IP block and integrate the public portion with the user's own design. The user can then generate a programming file based on the integrated HDL design that contains the configuration settings or "programming bits" to implement the user's design, including the public portion of the IP block, in a physical FPGA device.

In some implementations, the IP developer provides the secret portion of the IP block to the user in the form of programming bits without providing an HDL, RTL, or netlist implementation of the secret portion. The programming bits for the secret portion can be provided to the IP user in the form of a bitstream which may be part of an entire programming file. In some implementations in which the programming bits for the secret portion are provided as part of an entire programming file including bits for an entire physical FPGA device, the user merges the programming bits for the secret portion from the IP developers programming file with the IP user's programming file using a bitmask generated by the IP developer and also provided to the IP user. The merged programming file can then by loaded into a memory for programming into a physical FPGA device. In some other implementations, such as in implementations useful for partially-reconfigurable FPGA devices, a bitstream containing the programming bits for the secret portion can be programmed into the FPGA device after the rest of the FPGA design has been programmed to the FPGA device. In some such implementations, the rest of the circuit design already programmed into the FPGA device can be operational while the bitstream containing the programming bits for the secret portion are programmed into the FPGA device.

With the increased use and complexity of digital circuits, circuit developers have used hardware description languages to design digital logic descriptions and other aspects of digital circuits at a high level. Generally, a hardware description language (HDL) is a computer specification or modeling language that can be used to describe a circuit's operation, its design and organization, and tests to verify its operation by means of simulation. Examples of HDLs include Verilog (IEEE 1364), VHDL (VHSIC hardware description language), Abel (Advanced Boolean Expression Language), and Altera HDL (AHDL). The HDL enables a circuit developer to specify the functionality of a circuit at a high level without requiring the developer to specify a particular electronic technology and physical layout. Typically, the developer uses the HDL to specify a data flow model of the circuit with timing information. For example, a developer can specify his design using hard-coded logic such as HDL text-based expressions of the spatial and temporal structure and behavior of the circuit or system. This level of abstraction implemented with the HDL can be referred to as the register-transfer-level (RTL). The RTL design abstraction models a circuit design as a synchronous digital circuit in terms of digital signals (e.g., data) between, for example, hardware registers, as well as the logical operations performed on those signals by combinational logic.

An HDL-implemented design can be created using a computer-aided design (CAD) tool. For example, electronic design automation (EDA), also known as electronic CAD (ECAD), refers to software tools (e.g., CAD tools) for designing electronic systems including integrated circuits such as application specific integrated circuit (ASIC) gate arrays as well as programmable logic devices (PLDs) such as field-programmable gate arrays (FPGAs). Using such a CAD tool configured with an HDL, a developer can write or otherwise specify a circuit design. The developer can specify some or all of the design using HDL code, as described above. A developer also can use a high level synthesis language to generate a portion of the HDL-implemented design. For example, such high level synthesis abstraction languages include LabVIEW FPGA from National Instruments Corp., CoreFire Design Suite from Annapolis Micro Systems, Inc., SystemVerilog, Handel-C, and SystemC, among others. A developer or user also can import some or all of a design already specified in an HDL and build on or otherwise modify the imported design using a CAD tool.

When a developer completes a design in HDL, the CAD tool then performs an analysis (e.g., a code review or auditing) in preparation for synthesis. During the analysis, the HDL-implemented design is subject to a variety of error checking operations to aid in resolving errors before the HDL-implemented design is synthesized. In some implementations, the CAD tool can generate a hierarchical representation of the design based on the analysis that includes modules and calls between modules. Using an HDL design, a logic synthesizing tool, which can be incorporated into or integrated with the CAD tool used to design the HDL (and which is hereinafter also referred to generally as a CAD tool), then synthesizes the HDL-implemented design into a design implementation in terms of, for example, logic circuits and logic gates. In some instances, the result of the logic synthesis is a physically-realizable gate netlist. The netlist is generally a Boolean-algebra representation of the function of the circuit design implemented as logic gates or process-specific standard cells. In contrast to HDLs, netlist languages generally express only the circuit connectivity between a hierarchy of blocks or logic elements. That is, while HDLs can be used to express structural, behavioral, or RTL architectures that include temporal characteristics, netlist languages do not specify temporal characteristics. The netlist can then be output and, in some instances, provided to another party (e.g., an IP user) in the form of, for example, a "simulation" or "hand-off" netlist, or as a generic industry-standard EDIF (Electronic Design Interchange Format).

CAD tools used to design PLDs can generate binary programming files including bitstreams that contain programming bits for configuring the PLDs. An FPGA is one such type of PLD designed to be configured for use by a user after the physical FPGA device is manufactured. FPGAs contain programmable logic blocks and reconfigurable interconnects that allow the programmable logic blocks to be interconnected in different configurations. FIG. 1 shows an example implementation of a representative portion of an example FPGA architecture 100 (also referred to herein as FPGA device 100). The FPGA architecture 100 includes an array of configurable logic blocks (CLBs) 102, also known as logic array blocks (LABs), as well as configurable input/output (I/O) pads 104, switches 106, and a routing architecture or "fabric" 108. For example, the routing architecture 108 can include multiple vertically-oriented lines or channels 110 and multiple horizontal lines or channels 112 that connect the logic blocks 102 and I/O pads 104. Each logic block 102 generally includes one or more inputs 114 and one or more outputs 116. Various FPGA logic blocks 102 can be configured to perform as simple logic gates (e.g., AND gates, NAND gates, OR gates, NOR gates, and XOR gates, among others), to perform as logic circuits (e.g., multiplexers and arithmetic logic units (ALUs), among others), to perform complex combinational functions, to perform as memory elements (e.g., latches, flip-flops, and registers, or even entire blocks of memory), memory controllers, as well as to perform as complete microprocessors or processor cores. Although six logic blocks 102 are shown for purposes of explanation in FIG. 1, generally, an FPGA 100 or other PLD can include tens, hundreds, thousands, or more logic blocks 102 arranged in, for example, a two-dimensional array interconnected by the routing architecture 108. Particular implementations described in this disclosure are not limited to any particular type of FPGA or FPGA hardware layout (e.g., the layout of the logic blocks, routing architecture, and I/O pads). Some implementations may be suitable for other types of PLDs as noted.

Figure 2:
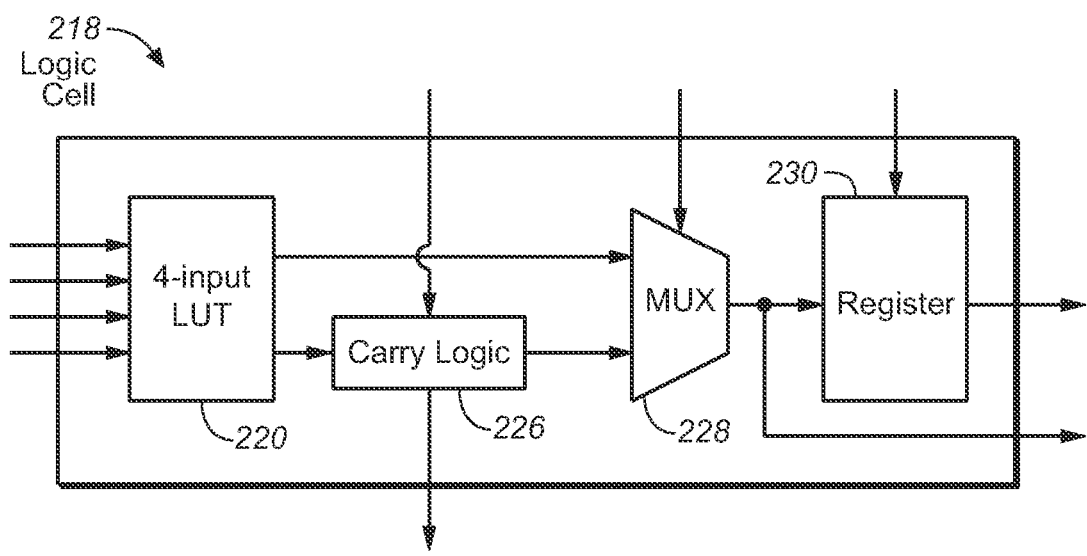
FIG. 2 shows an example implementation of a logic cell.

A typical FPGA logic block 102 includes one or more logic cells 218, also referred to as logic elements. FIG. 2 shows an example implementation of a logic cell 218. In some implementations, each logic cell 218 includes a look-up table (LUT) 220. For example, in some FPGA devices, each logic cell 218 includes a 4-input LUT 220. In some other implementations, each LUT 220 has 7 inputs, or another number of inputs. In some implementations, each LUT 220 is actually implemented as two or more lower input LUTs. For example, a 4-input LUT can be implemented as two interconnected 3-input LUTs.

Figure 3:
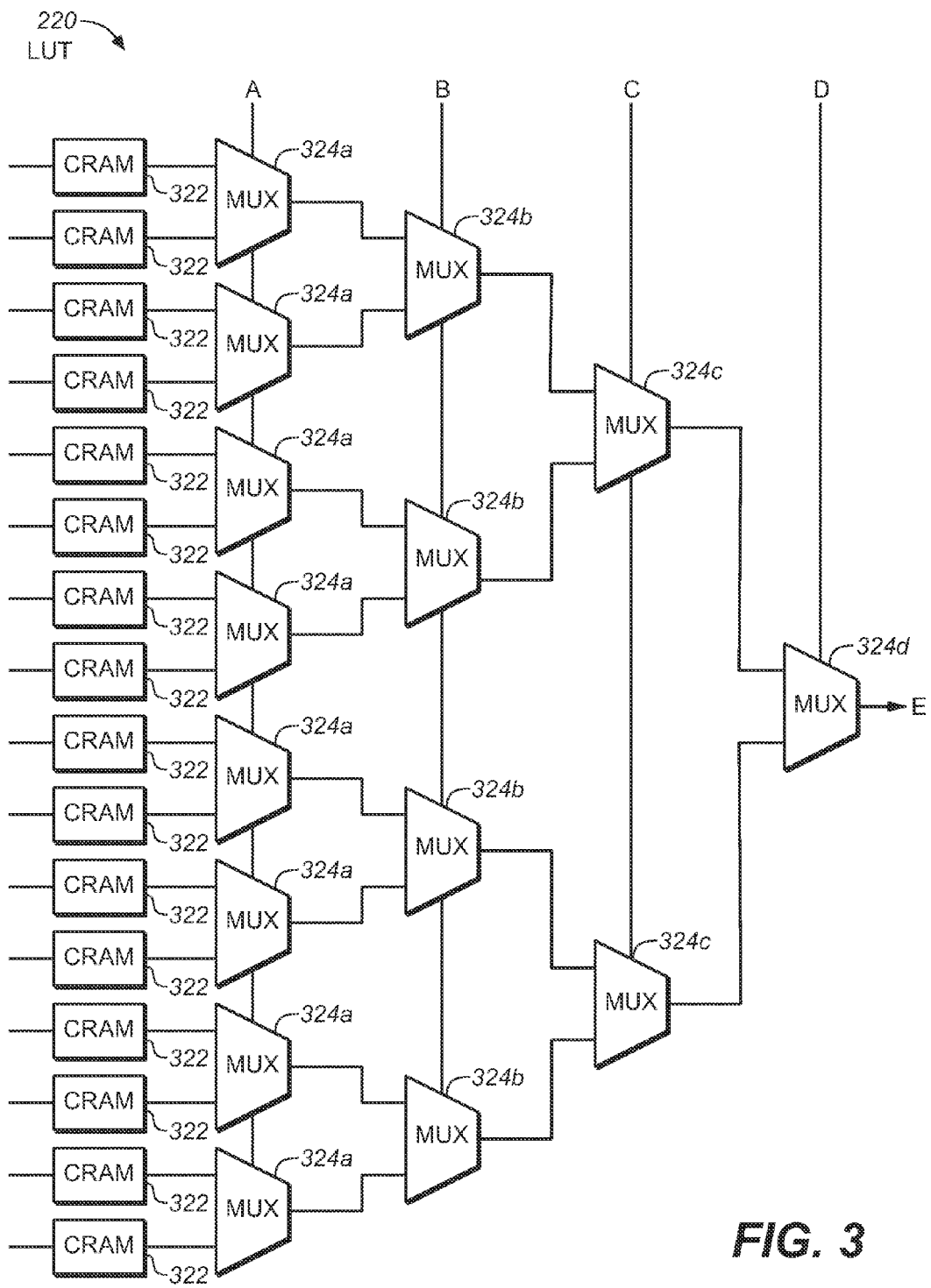
FIG. 3 shows an example 4-input LUT.

Many FPGAs are based on static random-access memory (SRAM). Typically, $2^n$ SRAM cells and corresponding bits are used to implement an n-input LUT—a LUT that maps "n" inputs or input functions to a single output. Thus, to implement a 4-input LUT, 16 SRAM programming bits can typically be required. The SRAM cells are often referred to as the configuration RAMs or "CRAMS." The programming bits programmed into the CRAMs (e.g., on power-up or during partial reconfiguration) to implement a circuit design such as an IP block are also referred to as the "configuration settings." In some implementations, each LUT 220 can be implemented as a $2^n$:1 multiplexer (or "MUX") where each CRAM provides the input to a corresponding input of the multiplexer. In some such implementations, a $2^n$:1 multiplexer can be implemented as $2^n-1$ individual 2:1 multiplexers. FIG. 3 shows an example 4-input LUT 220. The 4-input LUT includes 16 CRAMs 322 each providing an input to a 2:1 multiplexer of a first stage of multiplexers 324a. The outputs of the first stage of multiplexers 324a are the inputs to a second stage of multiplexers 324b. The outputs of the second stage of multiplexers 324b are the inputs to a third stage of multiplexers 324c. Finally, the outputs of the third stage of multiplexers 324c are the inputs to the fourth stage multiplexer 324d, which has a single output E. Each of the multiplexers of a given stage of multiplexers is controlled by a corresponding one of the inputs to the LUT 220. For example, the first stage multiplexers 324a are controlled by the first input A, the second stage multiplexers 324b are controlled by the second input B, the third stage multiplexers 324c are controlled by the third input C, and the fourth stage multiplexer 324d is controlled by the fourth input D. Based on the input signals A, B, C, and D, the set of multiplexers selects a bit to drive the output E. The bits in the CRAMs 322 dictate which logical operation or function is to be performed by the LUT 220. Each LUT 220 can generally implement any logical operation that can be specified with the number of inputs to the LUT. Thus, an n-input LUT can generally implement any logical function that can be specified with n or fewer binary inputs.

Other CRAMs 322 control or dictate the configuration of the switches 106 and the routing architecture 108 including the routing between logic blocks 102 and the routing between various other inputs and outputs (including between logic cells 208) and between the logic blocks 102 and the I/O pads 104. To program the functionality of the circuit design or designs into the FPGA device 100—that is, to configure the logic blocks 102, the I/O pads 104, the switches 106, and the routing architecture 108 needed by the circuit design—a user's CAD tool typically generates a programming file that includes the programming bits required for all of the IP blocks and other circuit designs of an entire FPGA design. The programming file can also include default values for the CRAMs in the physical FPGA device that are not used in the implemented FPGA design. The programming file also can generally include one or more commands or instructions. In some implementations or applications, the FPGA device 100 is connected to a circuit board. In some process flows, a programming tool transfers the programming file to a non-volatile memory, such as a Flash memory or EEPROM, on the same board as the FPGA 100. Upon power-up or based on an instruction, the FPGA 100 enters a programming or "configuration" mode or state (as opposed to an off state or a normal operating state). For example, upon the board powering up, some other logic, such as a controller, on the board with the FPGA 100 can cause the FPGA 100 to enter the configuration mode. When in the configuration mode, the FPGA 100 expects that some of its pins—its programming pins—are going to receive bits in a CRAM programming operation. The logic that caused the FPGA to enter the configuration mode, or some other logic on the board, such as a controller or memory controller, then retrieves the programming bits from the non-volatile memory and provides the retrieved programming bits to the FPGA 100. Logic within the FPGA 100 then programs the bits into the appropriate CRAMs 322 to configure the logic blocks 102 (e.g., the LUTs 210), the I/O pads 104, the switches 106, and the routing architecture 108 that forms the fabric interconnecting the logic blocks as well as the logic cells 218 within the logic blocks or other components of the FPGA design.

As shown in the example of FIG. 2, each logic cell 218 also can include one or more other elements such as, for example, carry logic (e.g., a full adder (FA)) 226, a multiplexer 228, and a register (e.g., a flip-flop such as a D flip-flop) 230. Register 220 may receive a clock signal from a global clock tree (not shown) of the FPGA 100. The register may receive the output signal E of the LUT 220 and output the signal E based on the clock signal. In some implementations, the FPGA 100 can include different types of logic cells 208. For example, various logic cells 208 can include LUTs 210 having various numbers of inputs. Other logic cells 208 also can include other hard-wired components such as multiplexers, demultiplexers, and registers. In some implementations, the FPGA 100 also can include an embedded processor and one or more memory blocks. As described above, many FPGAs are static RAM (SRAM)-based. SRAM-based FPGAs are volatile and thus the SRAM cells generally need to be configured upon every power-up. That is, each time the FPGA is powered on, some logic retrieves the programming bits from a memory (e.g., FLASH memory) also on the board and provides the programming bits to the FPGA. Logic within the FPGA then programs the bits into the appropriate CRAMs 322. Other types of FPGAs include SRAM-based FPGAs with integrated Flash, Flash-based FPGAs, and Antifuse-based FPGAs. Some FPGAs are configured as a system on a chip (SOC). For example, some SOC FPGAs produced by Altera Corporation integrate an embedded processor. For example, some Altera SOC FPGAs included an integrated hard processor system (HPS). Such an HPS can include a processor, peripherals, and memory interfaces using a high-bandwidth interconnect backbone.

In many modern applications, FPGA circuit developers design only a portion of an entire FPGA design. For example, one FPGA circuit developer can design a processor core, another FPGA developer can design a memory block, and still others can design other portions of the FPGA design. The various circuit developers may work for a single entity as part of different teams or for different entities (e.g., for different circuit developers in different business enterprises). At least in part due to the difficulty and expense of designing and verifying a circuit design, and the commerciability of the design, a designing entity may desire to keep the circuit design a secret, or at least desire not to disclose, or limit the disclosure of, the circuit design to other parties such as other developers, users, designers, or customers. A semiconductor intellectual property core, or simply "IP core" or "IP block," as used herein, refers generally to a circuit design for a PLD such as an FPGA. Generally, the IP block will constitute only a portion of a larger FPGA design. In various implementations, an IP block is designed to implement certain functions or functionality and may be designed to be integrated with another IP block or blocks of other users' designs and thus to work in conjunction with one or more IP blocks or other portions of a large FPGA design. Each IP block can be implemented in one or more logic blocks 102 and include one or more logic cells 218. Additionally, in some FPGA implementations, each logic block 102 can implement some or all of one or more IP blocks. The IP block is the design of, and typically intellectual property of, a particular circuit developer. The developer may sell or license use of the IP block to another developer or user that then implements the IP block into that user's own larger design, which may itself be a part of a larger design.

Although IP blocks can be sent to other parties, such as a user of an FPGA, as a netlist, IP blocks are typically sent at the RTL level, such as in the form of a synthesizable HDL-implemented design. Because the design is delivered in an HDL form, the user can modify the design at the functional level. However, as described above, because a developer may wish to keep the design secret (e.g., as a trade secret), because of the time and expense involved with verification, or for other reasons, a developer may not want the user to be able to have such access to the functional description of the circuit design. For example, because a circuit developer may not offer a warranty or support for the IP block if the design is modified, the circuit developer may desire to prevent an FPGA user from having access to the functional description of the circuit design. Providing the circuit design to the user as a netlist gives better protection against reverse engineering than providing the design in an HDL form, but reverse engineering can still be accomplished. The IP developer may also simply desire to ensure that the end user or customer receives the benefit of the verified implementation for the developer's own goodwill. Additionally, some IP developers are required to have their IP blocks independently verified by a third party to ensure a product integrating the design will meet functional safety requirements. This can be a significantly costly procedure. As such, an IP developer may seek to prevent an IP user from modifying the IP block so that verification of compliance with functional safety requirements isn't required or desired twice. Additionally, either or both of the IP developer and the IP user may seek to ensure that the IP block design is provided to the IP user as it was synthesized and verified by the IP developer. Because an IP user's CAD tool may synthesize, place, or route an HDL-implemented design differently than the IP developer's synthesis tool or the third-party-verifier's tool, an IP user cannot be guaranteed to generate the exact programming bits at the CRAM-level as the IP developer generated. For at least this reason, an IP user may desire the exact programming bits (at the CRAM bit level) that were generated by the IP developer because the design as implemented by the IP developer-generated programming bits has already been verified.

Figure 4:
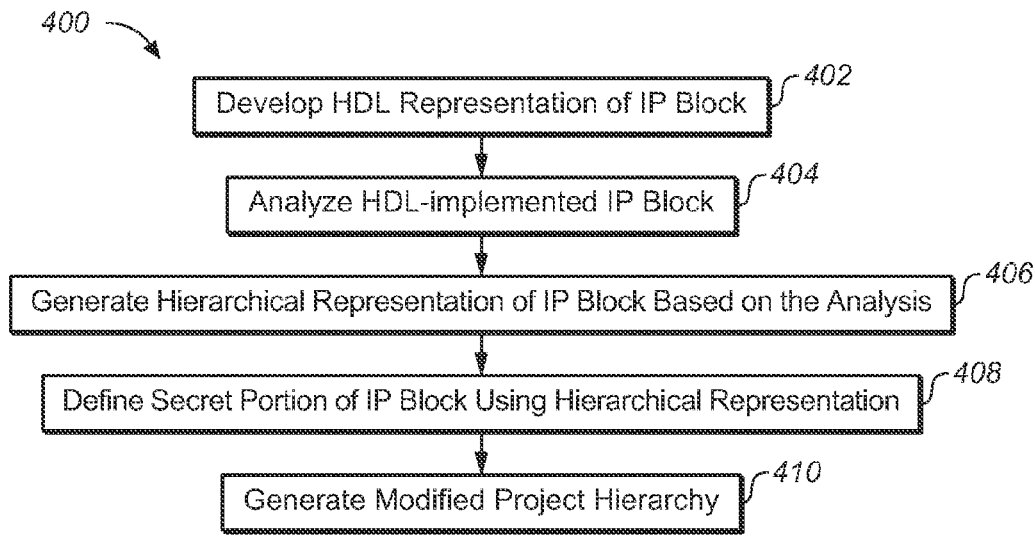
FIG. 4 shows a flowchart illustrating an example process for designing an IP block.

In particular implementations, the design process enables an IP developer to generate both a secret portion and a public portion for an IP block. FIG. 4 shows a flowchart illustrating an example process 400 for designing an IP block. In some implementations, process 400 begins at 402 with an IP developer developing an HDL representation an IP block. In some implementations, as described above, the IP developer designs or builds an HDL-implemented representation of the IP block using a CAD tool. For example, the CAD tool can include an input stage with a graphical user interface (GUI). The CAD GUI may include various "wizards" enabling efficient or convenient entry of information such as the parameters and specification for the IP block design. For example, the HDL-implemented IP block can be in the form of an RTL architecture. As described above, the IP developer can build the design using hard-coded logic or using pre-built functions, megafunctions, or other IP blocks. The IP developer also can use a high level synthesis abstraction language that can then be used by the CAD tool to generate an HDL description.

One example of a CAD tool with such HDL generation capabilities is the System on a Programmable Chip (SOPC) Builder available from Altera Corporation of San Jose, Calif. In some implementations, in addition to providing functionality to generate an HDL design, the CAD tool also can include functionality for performing analysis, synthesis, verification, placement and routing, and for the generation of configuration settings. That is, in some implementations, each of one or more of these functionalities can be a separate program or part of an integrated program within a single CAD tool. In some other implementations, one or more of the functionalities may be implemented in different hardware (and associated firmware and software) incorporated into or integrated within a single CAD tool. In some other implementations, the functionalities may be implemented in two or more different distinct tools. In some implementations in which each of a plurality of the functionalities just described are implemented as separate programs within a single CAD tool, an interface between the programs can be a database file, a log, or simply messages transmitted between the programs. For example, instead of writing a file to storage, the input stage can send messages directly to an HDL generator program that generates or integrates the HDL representation of the IP block. Similarly, the HDL generator program can provide the HDL representation directly to an analysis and synthesis tool.

At 404, the CAD tool then analyzes the HDL-implemented IP block. In some implementations, the CAD tool generates a project hierarchy (or hierarchical representation) of the IP block at 406 based on the analysis. In some implementations, the project hierarchy includes a hierarchical tree of all the modules of the IP block, including the modules each of these modules can instantiate, as well other connections or calls between the modules. At 408, the developer can then, using the CAD or other tool, partition or otherwise define the secret portion of the IP block by essentially boxing or blocking off the portion of the project hierarchy which the developer desires to include in the secret portion of the IP block. In so doing, the IP developer also defines a public portion of the IP block—the portions (if any) of the IP block which the developer will provide in HDL, netlist, or other functional representation form.

In some implementations, the CAD tool then generates, at 410, a modified project hierarchy that includes the public portion of the IP block but that does not include the modules within the secret portion of the IP block. In some implementations, the secret portion is represented in HDL as a call to instantiate a module that implements the secret portion, which itself can include several sub-modules. In some process flows, the public portion of the project hierarchy can then be delivered to an IP user. For example, the public portion can be delivered as the modified project hierarchy or in the form of a HDL. However, again, the secret portion of the design is not provided at the functional representation level whether in hierarchical (e.g., module) form, HDL form, or other functional representation form. By the IP developer providing the hierarchical representation of the public portion of the IP block to the IP user at this point, the user can then begin work on incorporating or integrating the IP block into the IP user's design. For example, by demarcating which modules form the secret portion of the IP block. In some implementations, the IP developer provides the modified project hierarchy or HDL-implemented design of the public portion to the IP user prior to the synthesis or verification of the IP developer's secret portion described below. For example, the IP developer may provide this early stage of the design to facilitate the overall speed and overall efficiency of the entire combined FPGA design process including those portions designed by the IP developer as well as those designed by the IP user receiving the IP developer's IP block. In some other implementations, the IP developer may provide the HDL-implemented design after synthesis and verification. Because the public portion can include a list or specification of all of the inputs and outputs of the entire IP block, the user can integrate the IP block within the user's own design without having knowledge of the secret portion of the IP block. In some implementations, the HDL file provided to the IP user includes a command or call (e.g., to a module or sub-module) that allows the IP user, using a CAD tool, to instantiate an instance of the public portion of the IP block in the user's own design. For example, the user's CAD tool, after instantiating the public modules, can connect the inputs and outputs of the IP block to one or more of the user's IP blocks or to other developer's IP blocks. The public portion also generally can include an interface to the secret portion, described below, as well as shared resources such as, for example, clock buffers, phase-locked loops (PLLs), and memory, among other shared resources.

Figure 5:
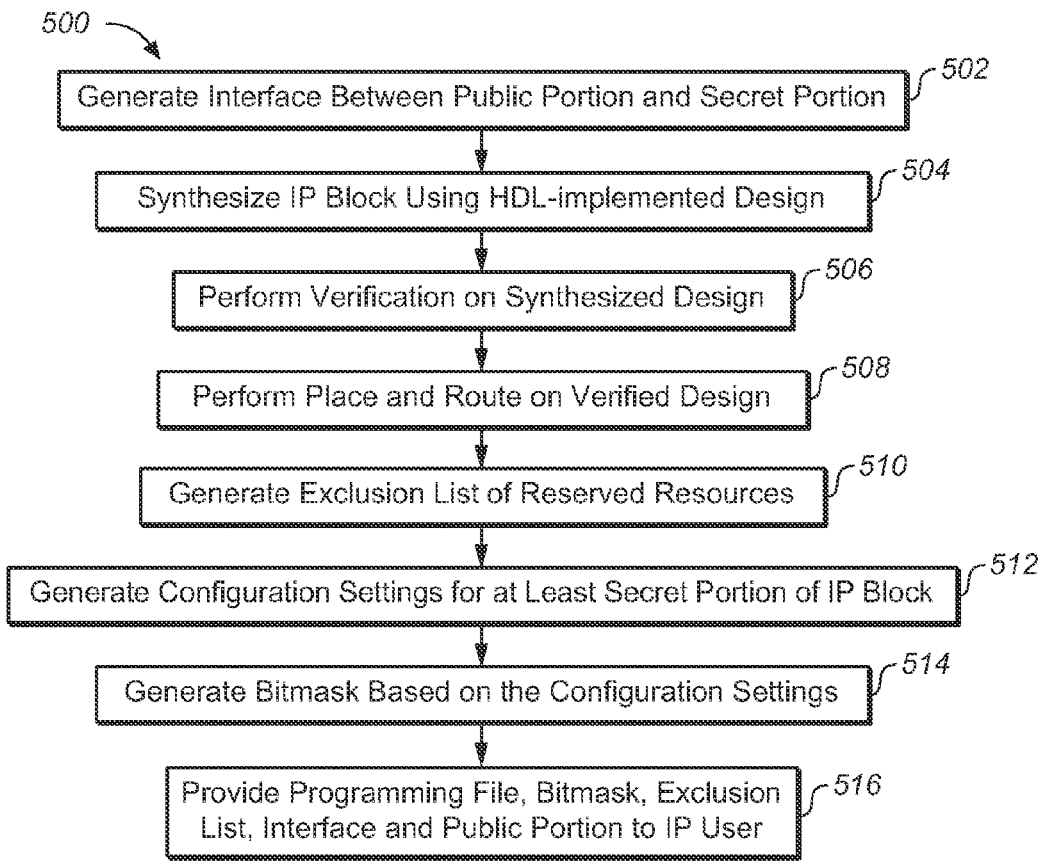
FIG. 5 shows a flowchart illustrating an example process for generating configuration settings for a secret portion of an IP block.

FIG. 5 shows a flowchart illustrating an example process 500 for generating configuration settings for a secret portion of an IP block. For example, the process 500 can be performed at the request or under the guidance of the IP developer that designed the IP block according to the process 400. In some implementations, the process 500 begins immediately after process 400. In some other implementations, one or more steps or blocks of the process 500 are performed in parallel with or intermingled with various steps or blocks of the process 400. In some implementations, the process 500 begins at 502 with the CAD tool generating an interface in the HDL-implemented design between the public portion of the IP block and the secret portion of the IP block (described above with reference to the process 400 of FIG. 4) based on the modified hierarchy or other functional or module level information about the interaction between the secret portion and the public portion. In some such implementations, the interface can be implemented with boundary LUTs. For example, the IP developer can design the IP block or the CAD tool can generate the IP block such that it includes LUTs at the boundary between the secret portion of the IP block and the public portion of the IP block. The boundary LUTs map signals and resources input to the boundary LUTs from the public portion to resources within the secret portion and map signals and resources output from the secret portion to resources within the public portion. In this way, while a CAD tool generally needs to have knowledge that it needs to route particular signals to particular boundary LUTs, the CAD tool does not need knowledge of the mapping performed downstream of an input LUT or upstream of an output LUT within the secret portion. In some such implementations, a boundary LUT can be defined logically as a single input buffer, the output of which is routed to a particular logic cell 218 in the physical FPGA design. In some such implementations, the boundary LUTs themselves are physically instantiated with CRAM programming bits using the LUTs 220 or other physical LUTs of the FPGA device 100. In some other implementations, one or more portions of the interface between the secret portion and public portion can be implemented with the functionality of a flip-flop, register, wire, or other logic or circuit component as physically instantiated with CRAM programming bits.

In some other implementations, the IP developer does not provide any public portion of the IP block to the IP user. For example, the IP developer may desire to keep the entire design secret. In some such implementations, the boundary interface generated at 502 is the only netlist, HDL, or other functional level representation of the IP block provided to the IP user. But rather than being an interface between the secret portion and a public portion, the interface is an interface between the secret portion and the outside (e.g., the IP user's FPGA design integrating the secret portion).

In some implementations, the process 500 proceeds at 504 with the IP developer's CAD tool performing a synthesis operation on the HDL-implemented representation of the IP block. Some examples of synthesis tools are Leonardo Spectrum, available from Mentor Graphics Corporation of Wilsonville, Oreg. and Synplify available from Synplicity Corporation of Sunnyvale, Calif. In some implementation, the CAD tool then, at 506, performs a verification operation on the synthesized design. Some example verification tools include Synopsys VCS, VSS, and Scirocco, available from Synopsys Corporation of Sunnyvale, Calif. and Cadence NC-Verilog and NC-VHDL available from Cadence Design Systems of San Jose, Calif. In some implementations, after verification at 506, the synthesized design can be provided to a physical design tool or program within the CAD tool where, at 508, a place and route operation is performed. A typical place and route tool locates logic cells on specific logic elements of a target hardware device and connects wires between the inputs and outputs of the various logic elements in accordance with the logic and security required to implement a design.

In some implementations, the CAD tool generates an exclusion list at 510 based on the output of the place and route operation. The exclusion list includes all of the resources that are to be reserved only for use by the secret portion of the IP block in the user's final FPGA design. Because the IP user receiving the IP developer's IP block will have no knowledge of how the secret portion of the IP block is using the actual FPGA hardware, the IP user ensures that the user's CAD tool, when integrating the IP developer's IP block with the IP user's design, doesn't use resources that the IP developer has reserved for the secret portion by avoiding using resources specified in the exclusion list. The resources specified in the exclusion list can include, for example, physical resources that will implement various logic blocks 102, logic cells 218, LUTs 220, I/O pads 104, switches 106, or other portions of the routing architecture 108 that are to be used only by the secret portion of the IP block.

A programmable logic configuration stage can take the output of the place and route tool and generate, at 512, configuration settings for an FPGA device 100. For example, the place and route tool and the logic configuration stage can be provided in the Quartus Development Tool, available from Altera Corporation of San Jose, Calif. As will be appreciated by one of skill in the art, a variety of synthesis, place and route, and programmable logic configuration tools can be used in various implementations. In some other implementations, a CAD tool can be configured to generate the configuration settings for an FPGA directly from an HDL-implemented design. In some implementations, the output of the configuration stage at 512 is a programming file that includes the configuration settings in the form of programming bits for the secret portion. In some implementations, while the programming file generally includes all the bits for all of the CRAMs 322 for a given physical FPGA hardware architecture, all of the bits in the programming file that are not generated for the IP developer's IP block are assigned default values. In some implementations, the bits designated for the public portion of the IP block also are assigned default values. In some implementations, the timing, power, or other requirements of the IP block can then be verified again, this time using the programming bits. For example, the programming bits for the secret portion, the public portion, and the interface between the secret portion and public portion (which may be included as a part of the public portion) can then be programmed into a physical FPGA device that is then subjected to verification. Additionally or alternatively, in some implementations, a third party (e.g., TUV Rheinland headquarted in Cologne, Germany) can perform the verification.

Figures 6A, 6B, 8A, 8B:
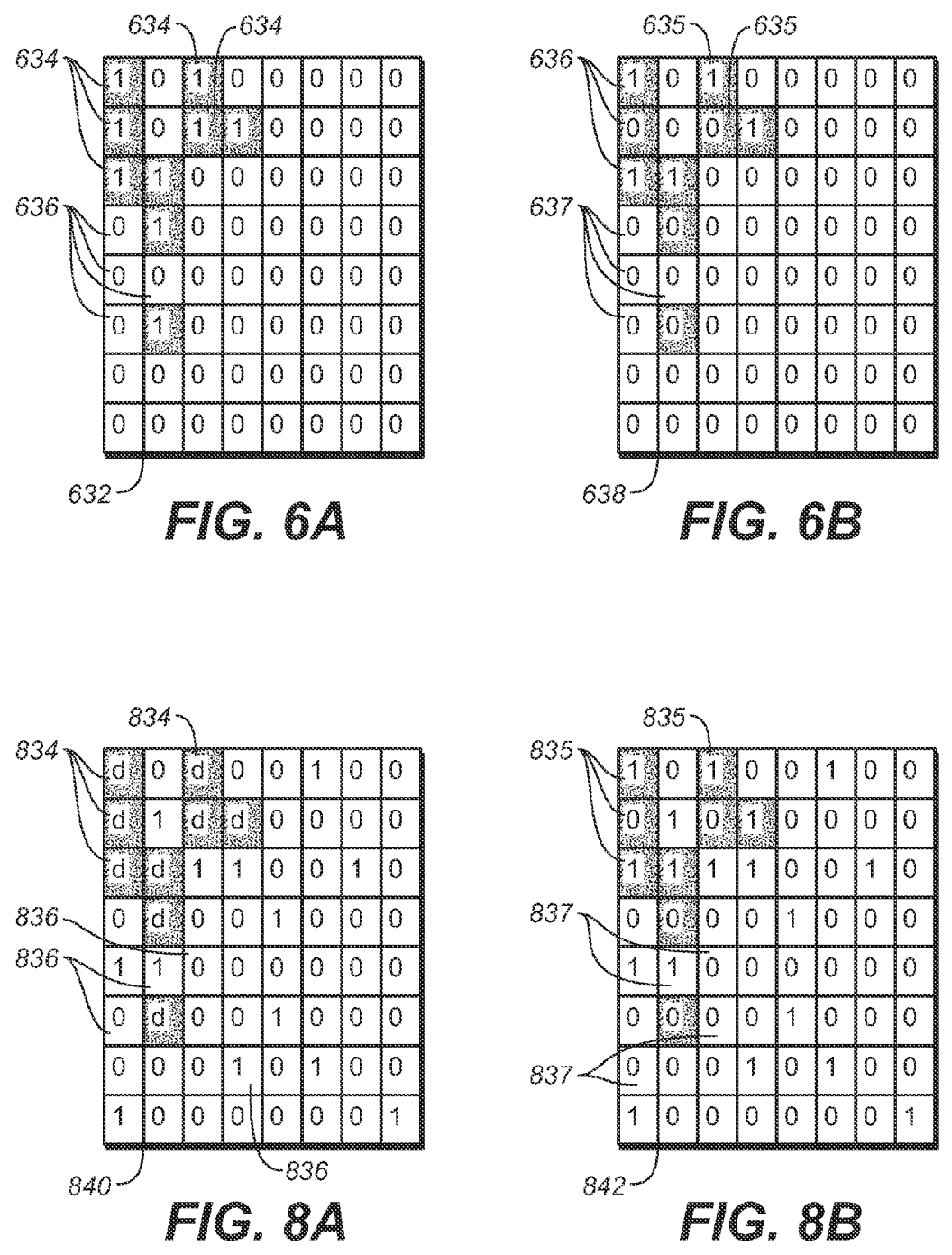

In some implementations, the process 500 proceeds at 514 with generating a bitmask. FIG. 6A shows an example bitmask 632 for didactic purposes. The bitmask generally identifies the bits in the IP developer's programming file that are used by the secret portion. Although the illustrated example bitmask 632 is only a an 8×8 array of 64 bit values, it should be appreciated that the bitmask required for some implementations can be much larger, for example, having hundreds, thousands, or more bit values. Because the programming bits required for the secret portion of the IP block can constitute only a portion of an entire programming file, the bitmask is used to identify those bits in the programming file that are to be used to configure the secret portion. In some implementations in which the secret portion of the IP block is to be configured into only a single logic block 102 or other portion, the bitmask can include just the bits associated with the logic block or other portion. In some other implementations, the bitmask can include bits for the entire programming file. In the illustrated example, all bits 634 having a bit value of logic value "1" indicate that the corresponding bit in the programming file is to be used in configuring the secret portion of the IP block. In contrast, all bits 636 having a bit value of logic value "0" indicate that the corresponding bit in the programming file is not to be used in configuring the secret portion of the IP block.

In some implementations, at 516, the programming file (including the configuration settings/programming bits for the secret portion of the IP block), the bitmask, the exclusion list of resources, the HDL or netlist-implemented interface (or other physical-level representation of the interface between the secret and public portions), and the HDL-implemented public portion (or public netlist or other functional level representation of the public portion), are provided to the IP user. While described as a single step 516, in some other implementations, various provisions of step 516 can be made independently or separately. For example, the exclusion list can be provided to the IP user prior to providing the programming bits for the secret portion (e.g., to facilitate speed and efficiency in the entire FPGA design process as a whole). The interface (which may be a part of the public portion) in whatever form provided to the IP user (e.g., as HDL or as part of a public netlist) discloses to the IP user the locations of the boundary LUTs or other interface components. This allows the IP user's place and route operation to connect the IP user's design with the IP developer's IP block. Thus, by disclosing the interface, the public netlist or HDL-implemented design of the public portion, as well as the exclusion list to the IP user, the IP user then has all the information (e.g., the IP block boundaries, inputs, and outputs, and resources) that the IP user needs to integrate the IP block with the IP user's own design without requiring knowledge of the functionality of the secret portion.

In some other implementations, rather than providing an exclusion list as just described, the IP developer instead uses floor-planning techniques to select and to indicate to the IP user portions or regions of the FPGA device that are to be reserved for the IP developer's IP block, and specifically, for the secret portion of the IP block. In some such implementations, the IP developer discloses only the maximal set of resources that may be used by the secret portion of the IP block, but not the specific resources that were actually generated by the IP developer's place and route operation. The method of floorplanning is particularly advantageous in cases where multiple IP developers are providing IP blocks for one user. If a floorplan is agreed upon in advance, and each IP developer's place-and-route is constrained to use resources only in the floorplanning region assigned to that IP developer, the IP user is assured that no resources will be in conflict when the various IP blocks are integrated into one design.

In some implementations, some or all of the programming file, including the bitstreams containing the programming bits, can be encrypted prior to delivery to the IP user. In some implementations, at least the programming bits for the secret portion are encrypted. FPGA devices, such as FPGA device 100, also can include decryption logic for decrypting encrypted bitstreams. In such implementations, it is generally the manufacturer or developer of the FPGA hardware that determines the encryption scheme and then provides methods, keys, or other encryption technologies to developers or users to encrypt their programming bits. In some such implementations, the FPGA device can be configured to decrypt encrypted programming bitstreams on-the-fly as they are provided to the FPGA device 100 and prior to loading into the CRAMs 322. FIG. 7 shows a flowchart illustrating an example process for integrating an IP block into an IP user's design. In some implementations, the process 700 begins at 702 with the IP user generating or importing an FPGA design into the user's CAD tool. The user's FPGA design will generally include one or more IP blocks and that will interface with at least one IP block generated by another IP developer. In some implementations, the IP user receives, at 704, a public netlist or HDL-implemented public portion of an IP developer's IP block, such as that described with reference to the processes 400 and 500 of FIGS. 4 and 5, respectively. In some implementations the public netlist also includes the locations of the interface inputs and outputs to the secret IP block to which the IP user's CAD tool must connect input and output signal wires on the chip. In some implementations the only public netlist provided by the IP developer is the implementation of the boundary inputs and outputs to the secret IP (e.g. boundary LUTs). The IP user also receives, at 706, the exclusion list generated by the IP developer's CAD tool, which specifies which resources in the FPGA design are to be reserved for use by the secret portion of the IP block. At 708, the IP user imports or otherwise provides the public netlist or HDL-implemented public portion and the exclusion list into the user's CAD tool. At 710, the CAD tool integrates the public portion with the rest of the user's design, for example, at the RTL, HDL, or netlist level.

In some implementations, the process 700 proceeds at 712 with the IP user's CAD tool performing an analysis and synthesis operation on the integrated design. In some implementations, the user's CAD tool then performs, at 714, a verification operation on the synthesized design. As described above, in some implementations, after verification at 714, the verified design can be provided to a physical design tool or program within the CAD tool where, at 716, a place and route operation is performed. During the place and route operation, the IP user's CAD tool can use the exclusion list to guarantee that it does not use resources reserved by the secret IP, and the synthesized interface between the secret and public portions (provided by the IP developer) to route the inputs and outputs between the secret and public portions of the IP block as indicated the IP developer thus linking up the IP block provided by the IP developer with the IP user's circuit design. A programmable logic configuration stage can then take the output of the place and route tool and generate, at 718, configuration settings for the IP user's design to be programmed into a physical FPGA device.

In some implementations, the output of the configuration stage at 718 is a programming file that includes the configuration settings in the form of programming bits for the entire FPGA device including the public portion of the IP developer's IP block. As described above (in the context of the IP developer's programming file), while the IP user's programming file generally includes bits for all of the CRAMs 322 for a given physical FPGA hardware architecture, all of the bits in the programming file that are not generated for the IP user's design, such as those reserved by the exclusion list for the secret portion of the IP developer's design, can be assigned default values. FIG. 8A shows an example portion 840 of the IP user's programming file in which the bits 834 that are to be used by the secret portion are identified with a default value (illustrated as "d") while the bits 836 that are not used by the secret portion include the values generated for them at 718. Because the IP user's CAD tool was provided with the exclusion list, this ensures that the place and route operation performed at 716 did not use any resources specified in the exclusion list, and thus, this ensures that the bits 834 will be left at default values. The IP user's CAD tool can verify that the tool correctly obeyed the exclusion list by comparing the generated CRAMs 840 with the provided bit mask 632—ensuring that no bit included with '1' in the bitmask 634 is assigned a value other than default, as in 834. In some implementations, at 720, IP user receives (if he has not done so already) the IP developer's programming file, such as that described above with reference to the process 500 of FIG. 5. At 722, the CAD or other tool then merges the IP developer's programming file with the IP user's programming file; that is, to merge the configuration settings/programming bits of the secret portion with the configuration setting/programming bits generated by the IP user (including the bits to implement the public portion and the interface of the IP developer's IP block).

FIG. 9 shows a flowchart illustrating an example process 900 for merging configuration settings for a secret portion of an IP block into an IP user's configuration settings. In some implementations, the process 900 is an example implementation of step 722 of process 700. In some implementations, the process 900 begins at 902 with the user's CAD tool operating on the IP developer's (previously received) programming file with the bit mask also provided by the IP developer. In some implementations, a bitwise comparison or bitwise addition is performed at 902. For example, FIG. 6B shows a bitstream (shown as a two-dimensional array) 638 that results from the bitwise application of the bitmask of FIG. 6A to an example IP developer's programming file. As shown, any bit 635 in the array of FIG. 6B that corresponds in location to a bit 634 in the bitmask of FIG. 6A keeps the value in the IP developer's programming file. Any bit 637 in the array of FIG. 6B that corresponds in location to a bit 636 in the bitmask of FIG. 6A is set to, for example, a default value. The process 900 can then proceed in 904 with the IP user's CAD or other tool performing a bitwise comparison between the result obtained at 902, as shown in FIG. 6B (for didactic purposes), and the IP user's programming file 840, as shown in FIG. 8A (for didactic purposes). For example, for each bit 635 in FIG. 6B that corresponds to a one of the secret programming bits, the value of that bit 635 is then added or otherwise entered into the IP user's programming file 840 in place of the default value in the corresponding bit location 834. FIG. 8B shows a merged programming file (or portion thereof) 842 that results from the bitwise application of the result 638 of FIG. 6B with the portion of the IP user's programming file 840 of FIG. 8A. As shown in the merged programming file 842, the bits 835 now have the values of the secret programming bits 635 that formerly held default values in bits 834 of the IP user's original programming file 840. In some implementations, at 906, the merged programming file is then stored in, for example, an external non-volatile memory (e.g., Flash) on the same board as the physical FPGA device. As described above, upon powering up the device, logic on the board is configured to cause the FPGA to enter a programming or configuration mode, to retrieve the programming bits from the non-volatile memory, and to load the retrieve programming bits into the FPGA device. Logic within the FPGA device then loads the programming bits into the appropriate CRAMs. By loading the values of the programming bits for the secret portion just as the IP developer had generated them, the IP developer can be assured that the functionality of the secret portion is as it was verified by the IP developer's CAD tool, while not disclosing the implementation of the secret portion to the IP user.

FIG. 10 shows a flowchart illustrating an example process 1000 for merging configuration settings for a secret portion of an IP block into an IP user's configuration settings. In some implementations, the process 1000 is an example implementation of step 722 of process 700. In some implementations, the process 1000 begins at 1002 with loading the programming bits of the IP user's programming file (e.g., as obtained at 718 of the process 700 of FIG. 7) into a physical FPGA device. In such implementations, the FPGA device is advantageously a partially-reconfigurable FPGA device. As described above, typically, configuring or reconfiguring an FPGA requires that the FPGA is in a configuration mode while an external controller or other logic loads an entire FPGA design into the FPGA device. In contrast, partial reconfiguration enables certain (e.g., critical) portions of the FPGA to continue operating while a controller loads a partial design into a reconfigurable module on the partially-reconfigurable FPGA device. Some time later, at 1004, the IP user can load the bitstream containing only those programming bits generated for the secret portion into the FPGA. For example, rather than receiving an entire IP developer's programming file at step 720 of process 700, the IP developer can select to only send a bitstream containing the programming bits for the secret portion. In other implementations, the IP developer can send an entire programming file and bit mask as described above to enable the IP user to extract a bitstream containing only those programming bits for the secret portion. Additionally, by sending the bitmask, the IP user also can ensure that the IP user's programming file doesn't use any of the bits reserved for the secret portion. As described above, the bitstream containing the programming bits for the secret portion can first be stored in a non-volatile memory on a board with the FPGA. A controller or other logic on a board with the FPGA can subsequently retrieve the bitstream and load the programming bits into the partially-reconfigurable FPGA device into the appropriate CRAMs. In some implementations, the bitstream containing the programming bits for the secret portion is received from the IP developer in an encrypted form so that the IP user has no knowledge of the bit values that were used to implement the secret portion of the IP developer's IP block; rather, the IP user only has knowledge of the bit locations that were given in the bit mask. As described above, some FPGA devices also can include decryption logic for decrypting encrypted bitstreams. In such implementations, it is generally the manufacturer or designer of the FPGA hardware that determines the encryption scheme and then provides methods, keys, or other encryption technologies to developers or users to encrypt their programming bits. In some such implementations, the FPGA device can be configured to decrypt the encrypted programming bitstream as it is provided to the FPGA device and prior to loading into the CRAMs.

FPGAs typically have many resources that will be shared among IP blocks, such as, for example, a global routing network or "tree," as well as other programmable power settings. In some implementations, the IP developer specifies to the IP user the topology of a global routing tree. In some such implementations, no functionality of the IP developer's IP block is disclosed at this time; rather, only information about what clock signals or other global signals are used, and in which regions of the FPGA design they are used, is disclosed. This information can be provided to the IP user even before the IP developer provides the public portion of the IP block to the IP user. The IP user then has the option of adding additional fanout to these signals for portions of the IP user's design that connect to the clocking network, for example, in the place and route operation performed at 716. For example, in either of the processes 900 or 1000 described above, when the IP developer runs the bitmask step 514 tool, the tool can additionally generate a network mask containing the bits for all of the wires or routing resources selected by the IP developer for the clocking network, along with the values/settings for those bits. Using the set of bits in the network mask, the IP user can verify that the programming file the IP user generates at 718 has identical values for all of the bits specified in the network mask. That is, that the clocking topology to be implemented in the physical FPGA remains the same. Power settings can be pre-selected and delivered by an IP user is a similar manner. For example, the IP developer can provide to a user a list of the power settings the developer has selected in the form of a mask with the bits to make those settings, and a programming file with the values for those bits. The IP user can then integrate those power settings into the user's design, as described above, and verify that the output of the design implements the power settings in the same manner that the IP developer implemented them.

Figure 11A:
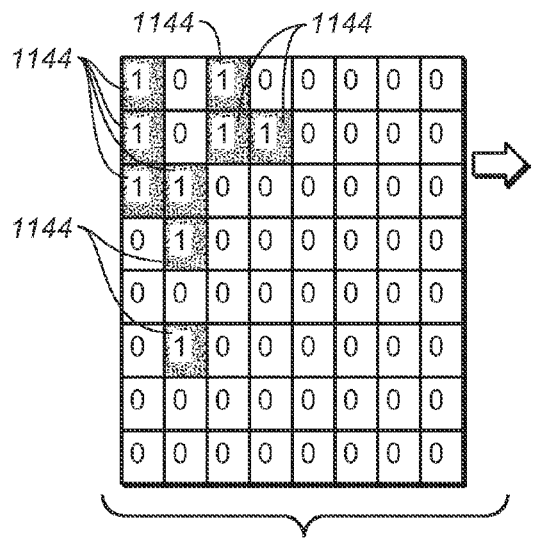
FIG. 11A shows an example bit array of a portion of an IP developer's programming file.
Figure 11B:
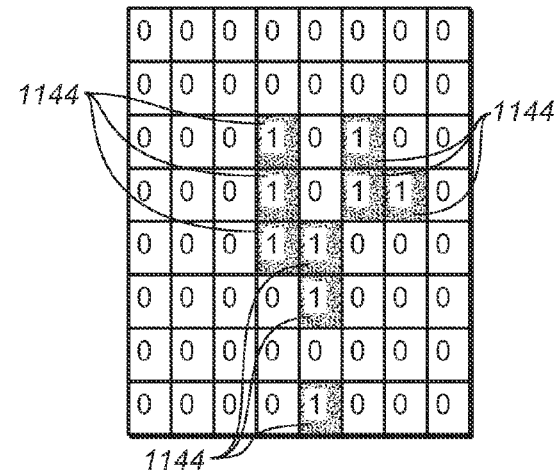
FIG. 11B shows the array of FIG. 11A after translocation of the programming bits for the secret portion

Additionally, in implementations in which the physical FPGA architecture into which the design is to be configured is arranged with uniformity in the chip floorplan, it can be possible to instantiate an IP block anywhere on the chip. In this manner, the IP user can determine where in the FPGA to implement the IP developer's IP block. For example, the IP user's CAD tool can, as before, take the programming bits for the secret portion received from the IP developer. To implement the IP block into a different floorplanning region or a different logic block, the IP user's CAD tool can trans-locate the public portion of the IP block's physical implementation (if provided), the interface entity locations, and also add an offset in the IP developer's programming file thereby indicating to the CAD tool the new set of resources that are to be reserved for the secret portion. In this way, the IP user can trans-locate the design of the IP block. For example, FIG. 11A shows an example bit array of a portion of an IP developer's programming file while FIG. 11B shows the array of FIG. 11A after translocation of the programming bits 1144 for the secret portion. In order to utilize the translocation functionality illustrated in FIGS. 11A and 11A, the IP user would also generally have to translocate the resources given in the exclusion list received at 706.

Figure 12:
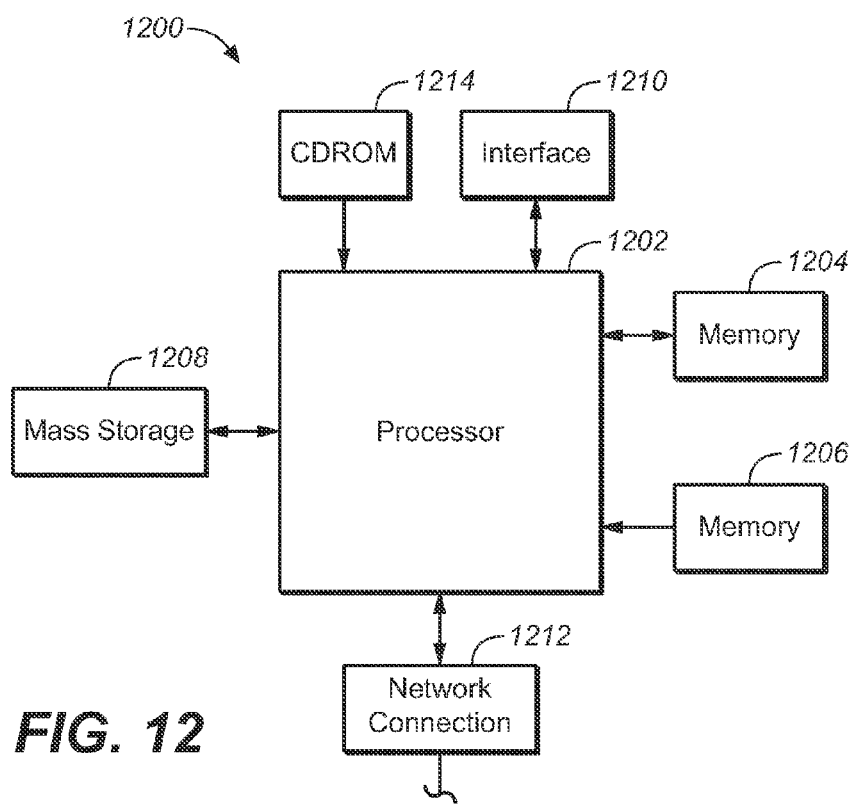
FIG. 12 shows a diagrammatic block diagram representation generally showing a computer system that can be used to implement some or all of the functionality of a CAD and other tools described above.

FIG. 12 shows a diagrammatic block diagram representation generally showing a computer system that can be used to implement some or all of the functionality of a CAD and other tools described above. The computer system 1200 includes any number of processors 1202 (also referred to as central processing units, or CPUs) that are coupled to devices including memory 1204 (typically a random access memory, or "RAM"), memory 1206 (typically a read only memory, or "ROM"). The processors 1202 can be configured to generate an electronic design. As is well known in the art, memory 1206 acts to transfer data and instructions uni-directionally to the CPU and memory 1204 is used typically to transfer data and instructions in a bi-directional manner.

Both of these memory devices may include any suitable type of the computer-readable media described above. A mass storage device 1208 is also coupled bi-directionally to CPU 1202 and provides additional data storage capacity and may include any of the computer-readable media described above. The mass storage device 1208 may be used to store programs, data and the like and is typically a secondary storage medium such as a hard disk that is slower than memory. The mass storage device 1208 can be used to hold a library or database of prepackaged logic or intellectual property functions, as well as information on generating particular configurations. It will be appreciated that the information retained within the mass storage device 1208, may, in appropriate cases, be incorporated in standard fashion as part of memory 1204 as virtual memory. A specific mass storage device such as a CD-ROM 1214 may also pass data uni-directionally to the CPU.

CPU 1202 also is coupled to one or more interfaces 1210 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 1202 may be a design tool processor. Finally, CPU 1202 optionally may be coupled to a computer or telecommunications network using a network connection as shown generally at 1212. With such a network connection, it is contemplated that the CPU 1202 might receive information from the network, or might output information to the network in the course of performing the above-described process steps. It should be noted that the system 1200 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes also can be used to practice the techniques of this disclosure. While particular embodiments have been particularly shown and described with reference to specific implementations thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. Additionally, certain steps in one or more of the processes above may be omitted, performed multiple times, performed in parallel, and performed in different orders. It is therefore intended that the invention be interpreted to include all variations and equivalents that fall within the true spirit and scope of the present invention.

What is claimed is:

1. A method comprising:
   generating, by or using a computer system, a hardware description language (HDL) implementation of a circuit design to be implemented on a programmable logic device (PLD) device;
   partitioning, by or using the computer system, the circuit design into a public portion and a secret portion;
   generating, by or using the computer system, an HDL implementation or a netlist implementation of the public portion without the secret portion included;
   generating, by or using the computer system, an HDL implementation or a netlist implementation of an interface for coupling the public portion and the secret portion;
   generating, by or using the computer system, a programming file containing configuration settings for only the secret portion based on the HDL implementation of the secret portion of the circuit design for use in programming the secret portion of the circuit design into a PLD device.

2. The method of claim 1, further comprising analyzing, by the computer system, the HDL implementation to generate a hierarchical implementation of the circuit design, wherein partitioning the circuit design into the public portion and the secret portion is performed at the hierarchical representation level.

3. The method of claim 1, further comprising:
   providing the HDL implementation or the netlist implementation of the public portion without the secret portion included to a third-party user; and
   providing the HDL implementation or the netlist implementation of the interface to the user including one or more boundary locations between the secret portion and the public portion.

4. The method of 1, wherein the configuration settings for the secret portion are generated in the form of programming bits.

5. The method of claim 4, wherein the programming file includes bit locations for an entire PLD design including the public portion, but wherein the bit locations of the programming file that are not part of the secret portion are assigned default values.

6. The method of claim 5, further comprising generating, by the computer system, a bit mask that includes a first set of bits each having a first logical value and a second set of bits each having a second logical value, each of the first set of bits being in a location of the bitmask that corresponds to a programming bit in the programming file used by the secret portion.

7. The method of claim 6, wherein the bitmask is configured to enable extraction of the programming bits for the secret portion so that they can be integrated with programming bits of a programming file generated by a third party the user that includes programming bits for the public portion of the design.

8. The method of claim 1, wherein the circuit design is to be implemented on a field-programmable gate array (FPGA) type of PLD device.

9. The method of claim 8, wherein the circuit design is to be implemented on a partially-reconfigurable FPGA.

10. The method of claim 9, wherein:
   the configuration settings for the secret portion are provided in the form of a bitstream of programming bits to the user; and the programming bits for the secret portion are configured for programming into the partially-reconfigurable FPGA device during operation of the FPGA device.

11. The method of claim 1, wherein the interface includes one or more boundary lookup tables (LUTs) for mapping signals from the secret portion to the public portion and from the public portion to the secret portion.

12. The method of claim 3, further comprising providing the configuration settings for the secret portion to the user without providing an HDL or a netlist implementation of the secret portion to the user.

13. The method of claim 12, further comprising:
generating, by the computer system, an exclusion list of resources to be reserved for the secret portion; and
providing the exclusion list of resources to the user.

14. The method of claim 12, wherein the configuration settings for the secret portion are generated in the form of programming bits, the method further comprising encrypting the programming bits for at least the secret portion prior to providing the encrypted programming bits for the secret portion to the user.

15. The method of claim 13, wherein, based on the HDL or netlist implementation of the public portion without the secret portion included, the HDL or netlist implementation of the interface, and the exclusion list, a computer-aided design (CAD) or synthesis tool can integrate the public portion and the interface with a circuit design of the user to generate an integrated design in which the resources specified in the exclusion list are reserved for the secret portion.

16. A method comprising:
generating, by or using a computer system, a hardware description language (HDL) implementation of a circuit design to be implemented on a programmable logic device (PLD) device;
partitioning, by or using the computer system, the circuit design into a public portion and a secret portion;
generating, by or using the computer system, an HDL implementation or a netlist implementation of the public portion without the secret portion included;
generating, by or using the computer system, an HDL implementation or a netlist implementation of an interface for coupling the public portion and the secret portion;
generating, by or using the computer system, a programming file containing configuration settings for only the secret portion based on the HDL implementation of the secret portion of the circuit design for use in programming the secret portion of the circuit design into a PLD device;
providing the HDL implementation or the netlist implementation of the public portion without the secret portion included to a third-party user;
providing the HDL implementation or the netlist implementation of the interface to the user including one or more boundary locations between the secret portion and the public portion;
providing the configuration settings for the secret portion to the user without providing an HDL or a netlist implementation of the secret portion to the user.

* * * * *